(12) United States Patent
Michels et al.

(10) Patent No.: US 9,478,765 B2
(45) Date of Patent: Oct. 25, 2016

(54) ELECTRO-OPTICAL DEVICE STACK, HAVING PATCHES COVERING LAYER BREACHES

(71) Applicant: Nederlandse Organisatie voor toegepast—natuurwetenschappelijk onderzoek TNO, 's-Gravenhage (NL)

(72) Inventors: Jasper Michels, 's-Gravenhage (NL); Paulus Wilhelmus Maria Blom, 's-Gravenhage (NL); Georg Thomas Jakob Götz, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 14/428,769

(22) PCT Filed: Jun. 14, 2013

(86) PCT No.: PCT/NL2013/050424
§ 371 (c)(1),
(2) Date: Mar. 17, 2015

(87) PCT Pub. No.: WO2014/046539
PCT Pub. Date: Mar. 27, 2014

(65) Prior Publication Data
US 2015/0249226 A1   Sep. 3, 2015

(30) Foreign Application Priority Data
Sep. 18, 2012   (EP) .................................... 12184890

(51) Int. Cl.
| H01L 51/50 | (2006.01) |
|---|---|
| H01L 51/42 | (2006.01) |
| H01L 51/56 | (2006.01) |
| C23C 14/22 | (2006.01) |
| C23C 14/54 | (2006.01) |

(Continued)

(52) U.S. Cl.
CPC ........... H01L 51/5088 (2013.01); C23C 14/22 (2013.01); C23C 14/54 (2013.01);

(Continued)

(58) Field of Classification Search
CPC .......... H01L 51/5088; H01L 51/5012; H01L 51/44; H01L 51/42; H01L 51/56; H01L 51/0037; H01L 2251/5392; H01L 2251/568; C23C 14/54; C23C 14/22
See application file for complete search history.

(56) References Cited

U.S. PATENT DOCUMENTS

| 2004/0054152 A1 | 3/2004 | Meerholz et al. |
| 2006/0251886 A1 | 11/2006 | Muller et al. |

(Continued)

FOREIGN PATENT DOCUMENTS

| JP | H1154286 A | 2/1999 |
| JP | 2003017262 A | 1/2003 |
| JP | 2006294484 A | 10/2006 |

OTHER PUBLICATIONS

European Extended Search Report—EP 12184890.7—Dated Apr. 26, 2013.

(Continued)

*Primary Examiner* — John P Dulka
(74) *Attorney, Agent, or Firm* — Banner & Witcoff, Ltd.

(57) ABSTRACT

A method of manufacturing an electro-optical device stack (10) includes providing a multi-layered structure comprising an electro-optical layer (13) that contacts a charge injection layer (12) comprising an acidic compound (12*m*). A resist layer (14) is deposited onto the electro-optical layer (13) and comprises a cationically-crosslinkable resist material (14*m*) that reacts adjacent breaches (12',13') in the electro-optical layer (13) by a cross-linking reaction. This reaction is induced by protons (12*p*) from the charge injection layer (12) and results in covering of the breaches (12',13') with patches (14*p*) comprising cross-linked resist material (14*c*). Parts of the resist material (14*m*) that have not cross-linked are removed, whereas the remaining patches (14*p*) provide electrical insulation between the charge injection layer (12) and a layer subsequently deposited onto the electro-optical layer (13).

15 Claims, 10 Drawing Sheets

(51) Int. Cl.
*H01L 51/44* (2006.01)
*H01L 51/00* (2006.01)

(52) U.S. Cl.
CPC .............. *H01L 51/42* (2013.01); *H01L 51/44* (2013.01); *H01L 51/5012* (2013.01); *H01L 51/56* (2013.01); *H01L 51/0037* (2013.01); *H01L 2251/5392* (2013.01); *H01L 2251/568* (2013.01); *Y02E 10/549* (2013.01)

(56) References Cited

U.S. PATENT DOCUMENTS

| | | |
|---|---|---|
| 2007/0034862 A1 | 2/2007 | Parham et al. |
| 2007/0196589 A1 | 8/2007 | Fu et al. |
| 2007/0290194 A1 | 12/2007 | Becker et al. |
| 2009/0026448 A1 | 1/2009 | Meyer et al. |
| 2012/0126277 A1 | 5/2012 | Tanaka et al. |
| 2012/0164761 A1 | 6/2012 | Yamazaki et al. |

OTHER PUBLICATIONS

Gather, Malte C. et al., "White Organic Light-Emitting Diodes", Advanced Materials, 2011, vol. 23, p. 233-248.

Köhnen, Anne et al., "The Simple Way to Solution-Processed Multilayer OLEDs—Layered Block-Copolymer Networks by Living Cationic Polymerization", Advanced Materials, 2009, vol. 21, p. 879-884.

International Search Report—PCT/NL2013/050424—Dated Sep. 30, 2013.

US 9,478,765 B2

ELECTRO-OPTICAL DEVICE STACK, HAVING PATCHES COVERING LAYER BREACHES

CROSS-REFERENCE TO RELATED APPLICATIONS

This application is a U.S. National Stage application under 35 U.S.C. §371 of International Application PCT/NL2013/050424 (published as WO 2014/046539 A1), filed Jun. 14, 2013, which claims priority to Application EP 12184890.7, filed Sep. 18, 2012.Benefit of the filing date of each of these prior applications is hereby claimed. Each of these prior applications is hereby incorporated by reference in its entirety.

FIELD AND BACKGROUND OF THE INVENTION

The present invention relates to an electro-optical device stack and a method and system for manufacturing the same.

Electro-optical device stacks are layered structures comprising an electro-optical layer capable of transducing electrical energy into optical (photonic) energy and/or vice versa. Typical applications include light emitting devices (LEDs) and photo-voltaic devices (PVDs). Within the field of electro-optical device stacks particular interest goes out to the use of organic layers. Organic layers may offer advantages such as providing a flexible device stack suitable for roll-to-roll (R2R) processing.

In one example, an organic light-emitting diode (OLED) comprises an active layer comprising light emitting organic molecules sandwiched between anode and cathode layers. When a voltage is applied over the active layer, this may result in (re)combination of electrons and holes in the active layer leading to photon emission. To create high efficiency devices, the device stack may comprise additional layers such as a charge injection layer that facilitate the injection of holes and/or electrons into the emissive layer. A charge injection layer may e.g. be formed of a material having a work-function between that of an electrode and that of the electro-optical layer. A typical charge (hole) injection layer may comprise an acidic compound such as PEDOT:PSS.

The inventors have found that efficiency and/or lifetime of electro-optical devices may deteriorate as a result of leakage current through the electro-optical layer. Leakage current may be considered wasted current in that it does not result in photon emission. One cause of leakage current may be the proximity and/or contact between the charge injection layer and the cathode layer. This may occur at breaches in the active layer wherein the active layer is absent and/or wherein the active layer comprises dentures or thinner areas between the charge injection layer and the cathode layer. Breaches may result e.g. from insufficient wetting (coverage) by the active layer on the charge injection layer and/or due to the formation of aggregates (bumps) in the charge injection layer that may stick partly or fully through the active layer into the cathode layer.

A partial remedy may be to increase the thickness of the active layer. However, this may lead to increased operating voltage and/or reduced power efficiency of the device.

Accordingly, there is a need for an electro-optical device stack having higher performance. In particular there is a need for a method and system that can conveniently produce such a device stack.

SUMMARY OF THE INVENTION

In a first aspect there is provided a method of manufacturing an electro-optical device stack, the method comprising providing a charge injection layer contacting an electro-optical layer, the charge injection layer comprising an initiator compound; depositing a resist layer onto the electro-optical layer, the resist layer comprising a resist material that reacts with the said initiator compound; having the resist material react adjacent breaches in the electro-optical layer by a reaction induced and/or catalyzed by the initiator compound from the charge injection layer thereby forming patches of reacted resist material covering said breaches; and removing parts of the resist material that have not reacted wherein the patches remain arranged for providing electrical insulation between the charge injection layer, and a layer subsequently deposited onto the electro-optical layer and patches.

In a first embodiment there is provided a method of manufacturing an electro-optical device stack, the method comprising providing a multi-layered structure comprising an electro-optical layer contacting a charge injection layer, the charge injection layer comprising an acidic compound; depositing a resist layer onto the electro-optical layer, the resist layer comprising a cationically-crosslinkable resist material; developing the resist material adjacent breaches in the electro-optical layer by a cross-linking reaction induced by protons from the charge injection layer thereby covering said breaches with patches comprising cross-linked resist material; and removing parts of the resist material that have not cross-linked, wherein the patches remain arranged for providing electrical insulation between the charge injection layer and a layer subsequently deposited onto the electro-optical layer and patches.

The presently disclosed process makes use of the phenomenon that excess protons from the charge injection layer may initiate crosslinking in a suited resist, preferably a cationically cross-linkable liquid formulation or raw material. In areas of the charge injection layer that are not or not sufficiently covered by the electro-optical layer (breaches), the resist deposited onto the electro-optical layer may be locally cross-linked by protons that may originate from the charge injection layer. After developing, the resist may remain on the previously exposed parts of the charge injection layer and this locally crosslinked resist may electrically insulate the charge injection layer from subsequently deposited layers such as a cathode layer.

Many suited resists may be known e.g. from use in conventional photolithographic processes. In a photolithographic process, a negative resist typically comprises additional photo-acid molecules to provide protons for the cross-linking reaction under the influence of exposure to light. In the presently disclosed process, additional photo-acid molecules are not necessary as protons may enter the resist layer from the charge injection layer via the breached areas in the electro-optical layer. Indeed, in a preferred embodiment, the resist does not comprise photo-acid molecules as these might provide cross-linking in non-desired areas. With respect to manufacturability, it is to be appreciated that the process is self-aligned and thus conveniently implemented, e.g. as a solution based process wherein the portions of the resist layer upon the breached areas are automatically targeted for the crosslinking process. Furthermore the charge injection layer or electro-optical layers do not need to be modified, allowing the presently disclosed process to be conveniently incorporated into existing manufacturing schemes. With respect to product performance, leakage current may be reduced which may result in increased device efficiency. Additionally, the thickness of the active layer may be decreased wherein the presently disclosed process may remedy possible breaches and/or leakage current. Accordingly, the presently disclosed process can conveniently produce an electro-optical device stack having higher performance.

It is noted that US2009/0026448 discloses a buffer layer between the charge injection layer and the active layer obtainable by coating a charge injection layer with a mixture comprising a material which can be rendered insoluble via a chemical reaction induced by the charge injection layer. In the cited document, it is thought that a cationically crosslinkable layer is able to take up diffusing cationic species, in particular protons which initiate a crosslinking reaction to form an insoluble layer. The buffer layer acts as a barrier to prevent protons from diffusing into the active layer. On the other hand, in the presently disclosed process, a cationically-crosslinkable resist material is applied on top of the active layer instead of between the active layer and the charge injection layer. Furthermore, in the presently disclosed process, the crosslinked resist forms electric insulating patches instead of an electrically conducting intermediate layer.

In a second embodiment, there is provided a method of manufacturing an electro-optical device stack, the method comprising providing a substrate with an electrode comprising a radical-polymerizable resist material and providing a multi-layered structure comprising an electro-optical layer on top of the substrate and the electrode; depositing a resist layer onto the electro-optical layer; developing the resist material adjacent breaches in the electro-optical layer by a radical-polymerization reaction induced by radicals from oxidizing material of the electrode thereby covering said breaches with patches comprising polymerized resist material; and removing parts of the resist material that have not polymerized, wherein the patches remain arranged for providing electrical insulation between the charge injection layer and a layer subsequently deposited onto the electro-optical layer and patches.

The method according to the second embodiment may have similar advantages as the method according to the first embodiment. The method according to the second embodiment makes use of the phenomenon that radicals from the oxidizing electrode may initiate crosslinking in suited resists. The electro-optical layer may be covered by the resist. Parts of the electrode that are not or not sufficiently covered by the electro-optical layer (breaches) may initiate cross-linking in the resist by means of radicals that may originate from the electrode. After developing, the resist may remain on the previously exposed parts of the electrode and this locally crosslinked resist may electrically insulate the electrode from subsequently deposited layers such as a cathode layer. Suited resists for this process may e.g. comprise radical-polymerizable molecules. With respect to manufacturability, it is to be appreciated that the process is self-aligned and thus conveniently implemented, e.g. as a solution based process wherein the parts of the resist adjacent breached areas are automatically targeted for the cross-linking process. Furthermore the electrode or electro-optical layers do not need to be modified, allowing the presently disclosed process to be conveniently incorporated into existing manufacturing schemes. With respect to product performance, leakage current may be reduced which may result in increased device efficiency and/or lifetime. Additionally, the thickness of the active layer may be decreased wherein the presently disclosed process may remedy possible breaches and/or leakage current. Accordingly, the presently disclosed process can conveniently produce an electro-optical device stack having higher performance and/or lifetime.

In a second aspect there is provided a system for manufacturing an electro-optical device stack, the system comprising a supply system, resist layer deposition means, resist layer removal means, and a controller, the controller arranged for controlling the supply system for providing a multi-layered structure comprising an electro-optical layer contacting a charge injection layer, the charge injection layer comprising an acidic compound; the controller further arranged for controlling the resist layer deposition means for depositing a resist layer onto the electro-optical layer, the resist layer comprising a cationically-crosslinkable resist material; the controller further arranged for controlling the device stack for having the resist material (14m) react adjacent breaches (12',13') in the electro-optical layer (13) by a cross-linking reaction induced by protons (12p) from the charge injection layer (12) thereby forming patches (14p) of cross-linked resist material (14c) covering said breaches (12',13'); and the controller further arranged for controlling the resist layer removal means, for removing parts of the resist material that have not cross-linked, wherein the patches remain arranged for providing electrical insulation between the charge injection layer and a layer subsequently deposited onto the electro-optical layer and patches.

A system according to the second aspect may have similar advantages as the method according to the first aspect.

In a third aspect there is provided an electro-optical device stack comprising a multi-layered structure comprising a charge injection layer comprising an acidic compound; a cathode layer; and an electro-optical layer arranged between the charge injection layer and the cathode layer; wherein breaches in the electro-optical layer between the charge injection layer and the cathode layer are covered with electrically-insulating patches comprising cationically cross-linked resist material.

The electro-optical device stack according to the third aspect may be conveniently manufactured by the method according to the first aspect and/or by the system according to the second aspect. Advantages of the electro-optical device stack may include high performance and/or low manufacturing cost. The electro-optical device according to the third aspect may have increased lifetime and durability as the patches may mitigate occurrence of leakage current. Leakage current may cause deterioration of the device stack, e.g. as a result of short-circuiting. The electro-optical device stack may be part of an electronic device such as a display or solar cell, wherein said electronic device may have similar advantages.

BRIEF DESCRIPTION OF THE DRAWINGS

These and other features, aspects, and advantages of the apparatus, systems and methods of the present invention will become better understood from the following description, appended claims, and accompanying drawing wherein:

DETAILED DESCRIPTION

Figure 1:
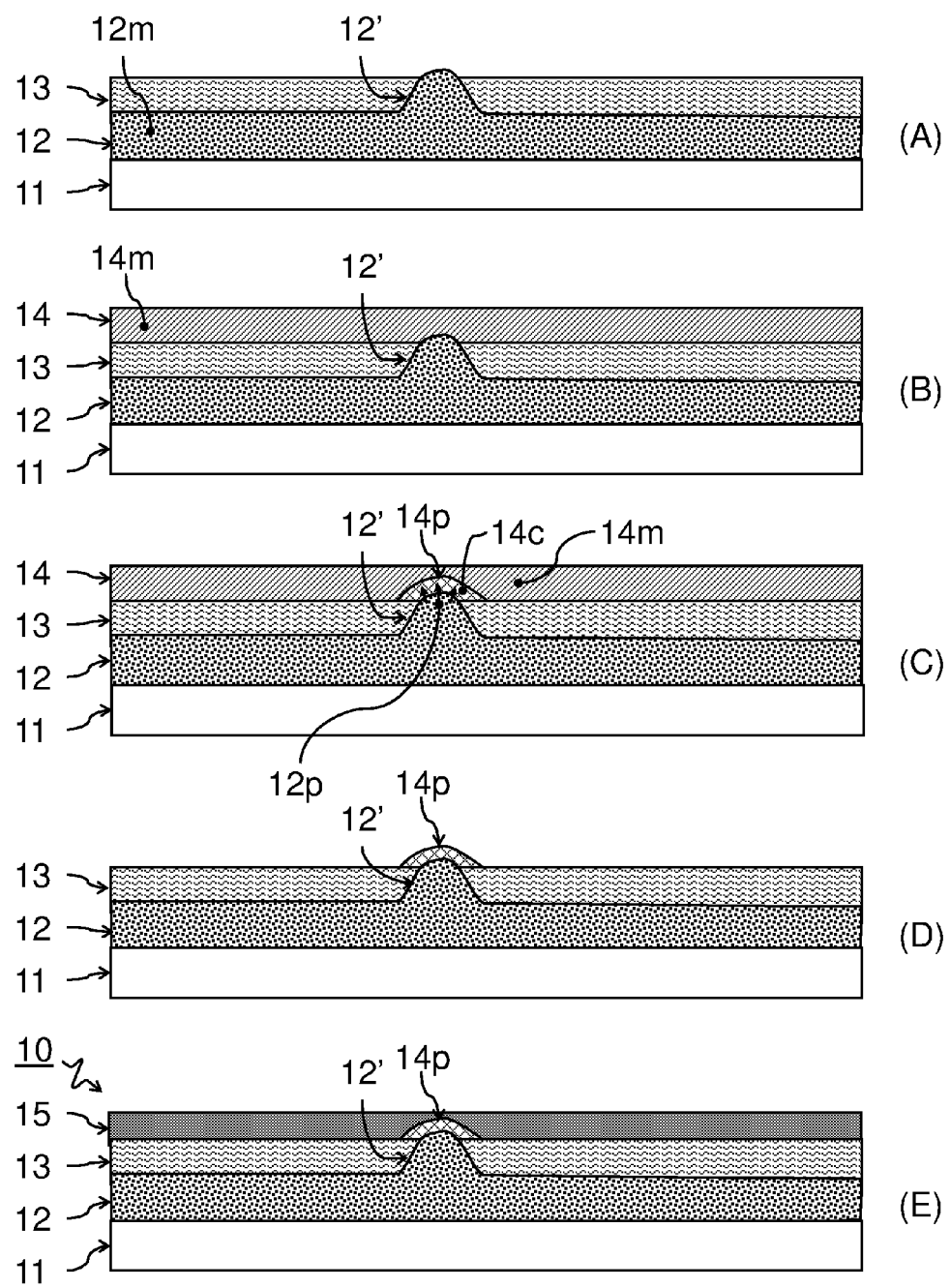
FIG. 1 shows an embodiment of a method of manufacturing an electro-optical device stack.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. As used herein, the term "and/or" includes any and all combinations of one or more of the associated listed items. Terminology used for describing particular embodiments is not intended to be limiting of the invention. As used herein, the singular forms "a", "an" and "the" are intended to include the plural forms as well, unless the context clearly indicates otherwise. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the size and relative sizes of systems, components, layers, and regions may be exaggerated for clarity. Embodiments are described with reference to cross-section illustrations that are schematic illustrations of possibly idealized embodiments and intermediate structures of the invention.

In the description, relative terms as well as derivatives thereof should be construed to refer to the orientation as then described or as shown in the drawing under discussion. These relative terms are for convenience of description and do not require that the system be constructed or operated in a particular orientation unless stated otherwise. It will further be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will further be understood that when a particular step of a method is referred to as subsequent to another step, it can directly follow said other step or one or more intermediate steps may be carried out before carrying out the particular step. Like numbers refer to like elements throughout.

FIG. 1 shows an embodiment of a method of manufacturing an electro-optical device stack 10.

In step (A), a multi-layered structure is provided comprising an electro-optical layer 13 contacting a charge injection layer 12. The multi-layered structure may be provided on a substrate 11. The charge injection layer 12 comprises an acidic compound 12*m*. The term "acidic" indicates that the charge injection comprises excess protons with a propensity to diffuse out of the charge injection layer into an adjacent layer. Preferably, the charge injection layer used in the present disclosure is a hole injection layer. A typical such charge injection layer may be formed by doping a polythiophene compound with a polymer-bound Brönsted acid, e.g. a sulfonic acid. In an embodiment, the charge injection layer 12 comprises poly(3,4-ethylenedioxythiophene) poly(styrenesulfonate) (PEDOT:PSS). Advantages of PEDOT:PSS may include beneficial film forming properties, water-solubility, conductivity (e.g. more than 100 S/cm), transparent to visible light, and stability. Another suitable hole injection layer may comprise an organic conductive ink known as Plexcore® comprising poly(thiophene-3-[2[(2-methoxyethoxy)ethoxy]-2,5-diyl)

In step (B), a resist layer 14 is deposited onto the electro-optical layer 13. The resist layer 14 comprises a cationically-crosslinkable resist material 14*m*, i.e. the resist material forms crosslinks, e.g. by polymerization, under influence of cations, e.g. protons, forming a network of crosslinks between the resist material molecules. In an embodiment said step of depositing a resist layer 14 onto the electro-optical layer 13, comprises depositing a solvent comprising the cationically-crosslinkable resist material 14*m* and evaporating the solvent. For PEDOT:PSS e.g. the solvent may be water. Also other suitable solvents may be used, e.g. if the electro-optical layer 13 comprises organic molecules sensitive to moisture. In another embodiment, the resist material is applied onto the electro-optical layer without a solvent. With or without solvent, the resist layer 14 may be applied by any suitable technique, such as printing (e.g. ink jet, gravure, flexographic, offset or screen printing), coating (e.g. spin coating, dip coating), physical/chemical vapor deposition, etc.

In step (C) the resist material 14*m* reacts adjacent a breach 12' in the electro-optical layer 13 by a cross-linking reaction induced by protons 12*p* from the charge injection layer 12. Therewith a patch 14*p* comprising cross-linked resist material 14*c* is formed that covers the breach 12'.

In an embodiment, said step of developing the resist material 14*m* comprises heating the device stack 10. The heating may speed up the reaction process in some resists. In addition or alternatively, the step of having the resist material 14*m* react may comprise waiting for a predetermined period of time for the cross-linking process to occur. Typical waiting times may be on the order of seconds up to minutes In some resists the proton may act as a catalyst that causes a cascading reaction resulting in a patch layer that grows thicker with time. The patch thickness and hence the amount of electrical insulation may thus depend on the time period that elapsed between the application of the resist material and the subsequent removal of the non-crosslinked resist material. The time period may also depend on the concentration of cross-linkable molecules in the solvent of the formulation. In some resists the proton may be used up in the reaction, wherein the reaction stops after a period of time resulting in a specific patch layer thickness. In some resists, the reaction may be very fast such that no substantial waiting time is needed. The steps of heating and waiting may be simultaneous or subsequent to each other. It is noted that while a proton may function as initiator, the subsequent cascade of cationic polymerization does not require additional protons. Termination can occur by e.g. by water residues In step (D), parts of the resist material 14m that have not formed cross-links, i.e. parts distant from the breach 12', are removed. The patch 14p remains to cover the breach 12' and is arranged for providing electrical insulation between the charge injection layer 12 and a layer subsequently deposited onto the electro-optical layer 13 and patches 14p.

In an embodiment, a conductivity of the cross-linked resist material 14c and/or a layer thickness of the patches 14p are arranged for providing in use, i.e. when an operating voltage is applied across the device stack (see e.g. FIG. 8 or 9), electrical insulation at least equal to that provided (on average) by the electro-optical layer 13 between the charge injection layer 12 and the subsequently deposited layer 15. Preferably, in use, the electrical insulation provided by the patch is higher than that of the average electro-optical layer, e.g. by a factor of 10 or higher. In other words, an electrical resistance between the charge injection layer 12 and the cathode layer 14 through the patch 14p is at least as high but preferably higher e.g. by a factor of 10 than an average electrical resistance through the electro-optical layer 13. Preferably, a patch has an electrical resistivity more than $10^{\wedge}7 \Omega$ cm. In one example, a patch is used comprising SU8, having an electrical resistivity of more than $10^{\wedge 15} \Omega$ cm. In use, when an operating voltage is applied over the electro-optical layer, an electrical current density through the patch 14p is preferably lower than an electrical current density through the electro-optical layer 13, e.g. by a factor of 10 or more. A leakage current through the breach 12' may be diminished to an acceptable level by the added electrical resistance of the patch.

In an embodiment, step (D) comprises applying a solvent known as a developer to the resist layer 14, wherein parts of the resist material 14m that have not cross-linked are soluble in the developer while the cross-linked parts of resist material, i.e. the patches 14p are insoluble in the solvent. The developer may e.g. be the same solvent as used in the application of the resist layer in step (B). A suitable developer may a solvent wherein the crosslinked material does not dissolve to a significant extent while the non-crosslinked material does dissolve. The process of steps (C) and (D) may be referred to as developing the resist. The term "insoluble" may mean that the chemical reaction of the material results in a layer or patch which can no longer be dissolved to a significant extent by the solvent with which the material was originally applied.

In step (E) an embodiment is shown wherein a cathode layer 15 is deposited onto the electro-optical layer 13 and patch 14p. The patch 14p may thus be arranged for locally providing electrical insulation between the charge injection layer 12 and the cathode layer 15. Instead of a cathode layer, also one or more intermediate layers may be applied onto the electro-optical layer 13. An example of an intermediate layer may e.g. comprise an electron transporting layer between the electro-optical layer 13 and the cathode layer 15. The patch 14p may thus be arranged for providing electrical insulation between the charge injection layer 12 and the intermediate layer.

Figure 2:
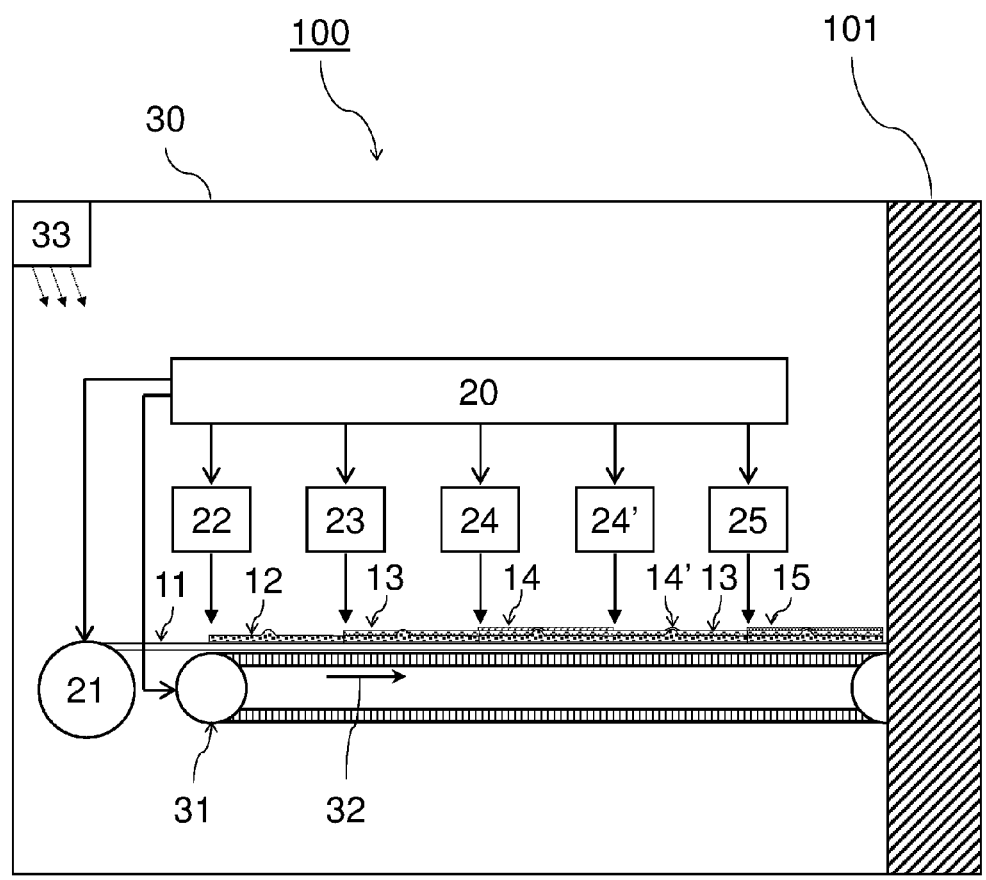
FIG. 2 shows an embodiment of a system for manufacturing an electro-optical device stack.

FIG. 2 shows an embodiment of a system 100 for manufacturing an electro-optical device stack. The system 100 comprises a supply system 21,31, resist layer deposition means 24, resist layer removal means 24', and a controller 20.

The controller 20 is arranged, i.e. configured and/or programmed for controlling the supply system 21,31 for providing a multilayered structure comprising an electro-optical layer 13 contacting a charge injection layer 12, the charge injection layer 12 comprising an acidic compound 12m. In an embodiment, the supply system comprises a supply roll 21 providing the said multilayered structure on a flexible substrate 11. The supply system may further comprise a transport system 31 arranged for transporting the multilayered structure between components of the system 100 such as the resist layer deposition means 24 and resist layer removal means 24', e.g. in a direction 32 as indicated. The transport system 31 may e.g. comprise a conveyor belt and/or a series of rolls to transport the substrate 11 and/or the device stack.

In another embodiment, the supply roll 21 comprises only the flexible substrate 11 and the multilayered structure is provided by subsequent layer deposition means 22 and 23. Accordingly in one embodiment, the system comprises a supply system 21,31 arranged for providing a substrate 11. The system comprises first deposition means 22 arranged for depositing a charge injection layer 12 onto the substrate 11, the charge injection layer 12 comprising an initiator compound. The system comprises second deposition means 23 arranged for depositing an electro-optical layer 13 onto the charge injection layer 12. The deposition means 22 and 23 may comprise any known layer deposition means, e.g. a print head arranged for printing the respective layers with or without respective solvents. The optional solvent used in depositing the charge injection layer may be evaporated before application of the electro-optical layer 13. Preferably, if a solvent is used in applying the electro-optical layer 13, this solvent does not dissolve the charge injection layer 12.

In one embodiment the system comprises resist layer deposition means 24 for depositing a resist layer 14 onto the electro-optical layer 13. The resist layer (14) comprises a resist material that reacts with the said initiator compound. In one embodiment, the resist layer 14 comprises a cationically-crosslinkable resist material 14m that (when contacting the layers) reacts with protons from an acidic charge injection layer. In another embodiment, the resist layer 14 comprises a radical-polymerizable resist material that reacts with radicals from an electrode comprised in the charge injection layer. The resist layer 14 may be applied using any known means, e.g. as discussed in step (B) above with reference to FIG. 1.

In one embodiment, the system comprises a controller 20 configured for controlling the supply system 21,31, first deposition means 22, second deposition means 23, and resist layer deposition means 24 for providing the substrate 11 with a multi-layered structure comprising the electro-optical layer 13 sandwiched between the charge injection layer 12 and the resist layer 14. The controller 20 is further arranged for controlling the device stack for having the resist material 14m react adjacent breaches in the electro-optical layer 13 by a cross-linking reaction induced by protons from the charge injection layer 12. Therewith patches are formed comprising cross-linked resist material, which patches may cover the breaches. The reaction may be controlled, e.g. by controlling a time-interval between the application of the resist layer 14 and the subsequent removal. Optionally, the system may additionally comprise a heater (not shown), wherein the controller 20 controls a temperature of the heater to control a rate of the cross-linking process, e.g. as discussed in step (C) above with reference to FIG. 1.

In one embodiment, the system comprises resist layer removal means 24' arranged for at least partially removing the said resist material 14m. The controller 20 is further arranged for controlling the resist layer removal means 24', for removing parts of the resist layer 14 from the electro-optical layer 13 that have formed cross-linked material. The patches 14' comprising crosslinked material remain on the stack to cover breaches in the electro-optical layer 13. The patches 14' may thus be arranged for providing electrical insulation between the charge injection layer 12 and a layer subsequently deposited onto the electro-optical layer 13 and the patches 14'.

The controller 20 is thus configured for controlling the device stack for having the resist material 14m react adjacent breaches 12',13' in the electro-optical layer 13 by a reaction induced and/or catalyzed by the initiator compound 12p from the charge injection layer 12 thereby forming patches 14p of cross-linked resist material 14c covering said breaches 12',13' and the controller is configured for controlling the resist layer removal means 24' for removing parts of the resist material 14m that have not reacted.

In the embodiment shown, the system 100 further comprises electrode layer deposition means 25. The controller 20 is further arranged for controlling the electrode layer deposition means 25 for depositing a cathode layer 15 onto the electro-optical layer 13 and patches 14. The patches 14p are thus arranged for providing electrical insulation between the charge injection layer 12 and the cathode layer 15 at the location of the breaches.

The system 100 may comprise additional processing means 101 e.g. further layer or component deposition means or means for sealing and/or cutting the substrate. Alternatively or in addition, the additional processing means 101 may comprise a second roll on which the device stack may be stored, e.g. a in a R2R process.

In one embodiment, the system comprises a supply system (not shown) arranged for supplying the various layer deposition means with respective layer materials and/or supplying the resist layer removal means with a material for removing part of the unreacted resist layer. Preferably, the materials are supplied in liquid form, e.g. in a solvent that can be evaporated after deposition. Some layers may be formed by combining one or more precursor compounds that are mixed and/or reacted to form said layers.

In one embodiment, the first layer deposition means 22 comprises a charge injection material supply that is, in use, filled with a charge injection material (or precursor(s) for such material) to be deposited on the substrate 14 to form the charge injection layer 12). In one embodiment, the charge injection material comprises an acidic compound. In one embodiment, the charge injection material comprises PEDOT:PSS.

In one embodiment, the second layer deposition means 23 comprises an electro-optical material supply that is, in use, filled with an electro-optical material (or precursor(s) for such material) to be deposited on the charge injection layer 14 to form the electro-optical layer 13. In one embodiment, the electro-optical material and/or the layer 13 comprises light emitting polymers. In one embodiment, the electro-optical material and/or the layer 13 comprises light absorbing polymers e.g. for building a photovoltaic device.

In one embodiment, the resist layer deposition means 24 comprises a resist material supply that is, in use, filled with a resist material (or precursor(s) for such material) to be deposited on the electro-optical layer 13 to form the resist layer 14. In one embodiment, the resist material comprises a cationically-crosslinkable resist material. In one embodiment, the cationically-crosslinkable resist material comprises rings containing heteroatoms which react by cationic ring-opening polymerization. In one embodiment, the cationically-crosslinkable resist material comprises epoxides. In another embodiment, the resist material comprises a radical-polymerizable resist material.

Accordingly, in one embodiment, the charge injection layer 12 comprises an acidic compound 12m and the resist layer 14 comprises a cationically-crosslinkable resist material 14m that reacts to the acidic compound 12m by a crosslinking reaction. In another embodiment, the charge injection layer 12 comprises an electrode 16 comprising an oxidizing material and the resist layer 14 comprises a radical-polymerizable resist material that reacts to radicals 12p of the oxidizing material of the electrode 16 by a polymerization reaction, e.g. a crosslinking reaction that locally reduces the solvability of the resist layer.

In one embodiment, the resist layer removal means 24' comprises a resist removal supply that is, in use, filled with a resist removal material for removing at least part of the resist layer, in particular those parts that have not reacted with the initiator compound. The resist removal material may e.g. comprise a solvent wherein unreacted parts of the resist layer dissolve in the solvent. By contacting the resist removal material with the previously deposited resist layer, parts of the resist material that have not reacted with the charge injection layer are removed while patches 14p remain arranged for providing electrical insulation between the charge injection layer 12, and a layer 15 subsequently deposited onto the electro-optical layer 13 and patches 14p. In one embodiment, the resist removal material is flushed over the resist layer 14.

In the present embodiment of the system 100, the device stack is subjected to continuous processing, e.g. as in R2R or R2S (roll-to-sheet) process. Such continuous processing may have advantages of scalability and/or economic advantages. Advantageously, the presently disclosed methods and systems are very suitable for such continuous processing, wherein any breaches in the electro-optical layer 13 are automatically sealed by the self-targeting process of the applied resist layer 14. Alternatively to continuous processing, the presently disclosed methods and systems are also applicable to discrete processing, e.g. wherein the process is applied to one substrate at a time. Such a discrete process may be advantageous, e.g. if the resist layer 14 is applied using spin-coating.

In one embodiment, the system is arranged for providing a sequence of treatment steps wherein the resist layer deposition means 24 is arranged directly after the second layer deposition means 23 that deposits the electro-optical layer 13 onto the charge-injection layer 12. By depositing the resist layer onto the electro-optical layer 13 that is on top of the charge-injection layer, the material of the resist layer 14 can react with the charge-injection layer 12 in case there is a breach in the electro-optical layer 13 thus forming an electrically-insulating patch 14p over the said breach. In one embodiment, as shown, the system comprises a substrate transport system 31 arranged to carry the substrate 11 along the said sequence of treatment steps, wherein the treatment in sequence comprises the first layer deposition means 22, the second layer deposition means 23, and the resist layer deposition means 24 as detailed above.

While the system 100 is shown in a particular configuration, e.g. relative orientation with respect to the substrate 11 and/or the device stack, the present disclosed methods and systems are not limited to such configuration. E.g. in another embodiment, some or all of the present layer deposition means may be arranged for physical vapor deposition (PVD), wherein a layer may be deposited onto a substrate from below while the substrate is carried or held over a source of evaporating material to be deposited. However, it is noted that the presently disclosed methods and systems are well suited to solution based layer deposition processes (e.g. a solvent with a resist material) which in some cases may be faster than e.g. vapor deposition processes.

In the shown embodiment, the system 100 further comprises an enclosure 30. Some or all of the processing may be performed inside the enclosure. An environmental control system 33 may be used to provide a low-humidity and/or low oxygen environment inside the enclosure 30. For example, dry nitrogen may be flushed through the enclosure for providing an environment with low humidity and low oxygen. Alternatively or in addition, the enclosure may be kept at low pressure, e.g. vacuum.

Figure 3:
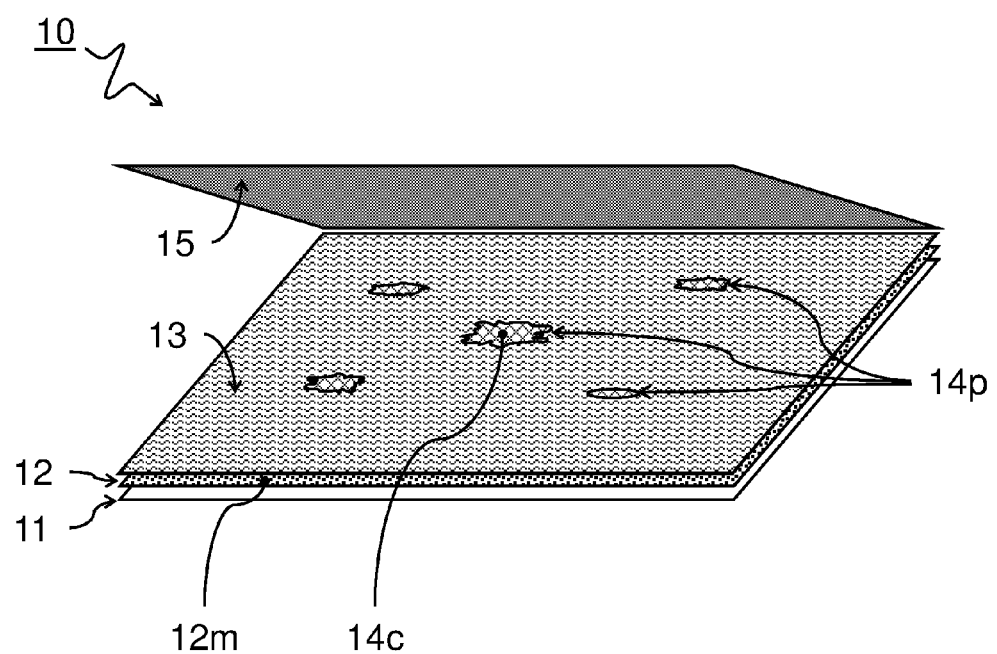
FIG. 3 shows a perspective view of an embodiment of an electro-optical device stack.

FIG. 3 shows a perspective view of an embodiment of an electro-optical device stack 10 comprising a multi-layered structure. The multi-layered structure comprises a charge injection layer 12 comprising an acidic compound 12m. The multi-layered structure further comprises a cathode layer 15 that is shown here peeled back for illustrative purposes to reveal the layer underneath. The multi-layered structure further comprises an electro-optical layer 13 arranged between the charge injection layer 12 and the cathode layer 15. Breaches in the electro-optical layer 13 between the charge injection layer 12 and the cathode layer 15 are covered with electrically-insulating patches 14p comprising cationically cross-linked resist material 14c.

In a preferred embodiment, a conductivity of the cross-linked resist material 14c and a layer thickness of the patches 14p are arranged for providing electrical insulation at least equal to that provided on average by the electro-optical layer 13 between the charge injection layer 12 and the subsequently deposited layer 15. The optional substrate 11 supporting the multi-layered structure may be flexible or non-flexible. In some embodiments, the charge injection layer 12 may act as an anode. In other embodiments, there may be provided an additional anode electrode and/or layer.

Figure 7:
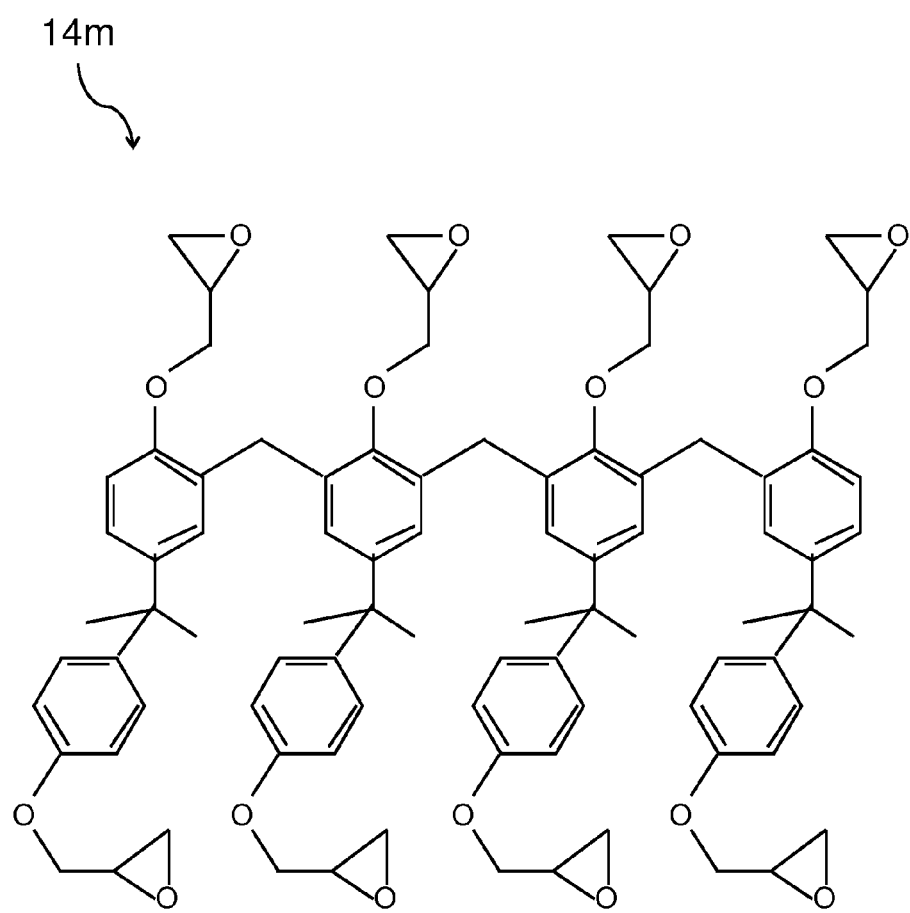
FIG. 7 shows an example cationically-crosslinkable resist material.

In one example, a device stack 10 subsequently comprises a glass substrate 11, an anode layer (not shown here) comprising Indium Tin Oxide (ITO), a charge injection layer 12 comprising a mixture of poly(3,4-ethylenedioxythiophene) poly(styrenesulfonate) (PEDOT:PSS), an active layer 13 comprising polyphenylene vinylene (PPV), and a cathode layer 15 comprising barium and aluminium. These may be applied in a sequential evaporation of e.g. (nominally) 5 nm Ba and 100 nm Al. The device stack 10 comprises electrically insulating patches 14p comprising resist material (14m) as shown in FIG. 7 that has undergone a cationically stimulated cross-linking reaction.

Although there is in principle no limitation to the area size that can be covered by the electrically insulating patches 14p, in a preferred embodiment, patches 14p have an area size (measured parallel to the device stack 10) smaller than 1 mm$^2$, preferably smaller than 0.1 mm$^2$, more preferably smaller than 0.01 mm$^2$. The size of the patches 14p may generally be related to a size of the breaches in the electro-optical layer 13. These breaches are preferably kept as small as possible, e.g. to minimize dark spots in the electro-optical layer 13. For example, if the device stack 10 is used as part of a display device, these dark spots may be particularly visible if they are larger than the above mentioned area sizes.

For photovoltaic devices, the visibility of patches may be less relevant. However, also for photovoltaic devices, it may be preferred to minimize a size of the breaches since these may larger breaches may correspond to lower device efficiency. An electro-optical device stack manufactured according to the present disclosure may thus find application e.g. in display devices as well as photovoltaic devices.

Figure 4:
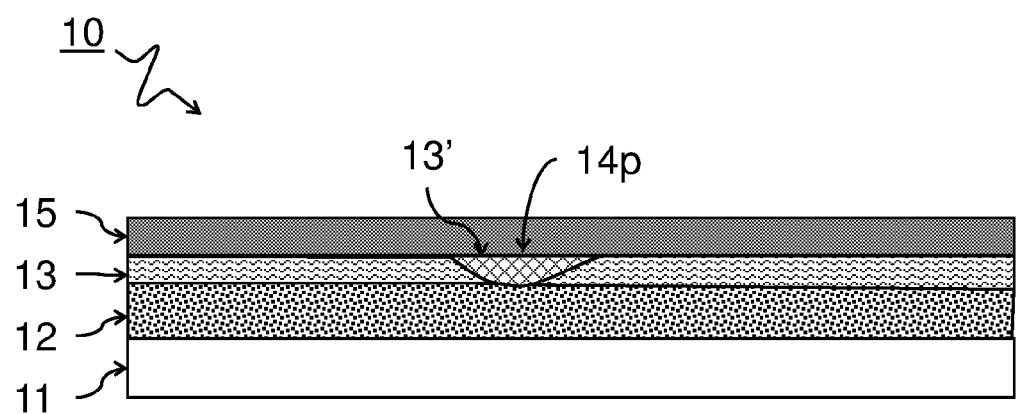
FIG. 4 shows a cross-sectional view of another embodiment of an electro-optical device stack.

FIG. 4 shows a cross-sectional view of another embodiment of an electro-optical device stack similar to that shown in step (E) of FIG. 1. Different from FIG. 1, the breach 13' through the electro-optical layer 13 is not caused by a bump (aggregate) in the charge injection layer 12 but by insufficient wetting (coverage) of the electro-optical layer 13 on the charge injection layer 12. Similar as in FIG. 1, the breach is covered by an electrically insulating patch 14p between the charge injection layer 12 and cathode layer 15.

Figure 5:
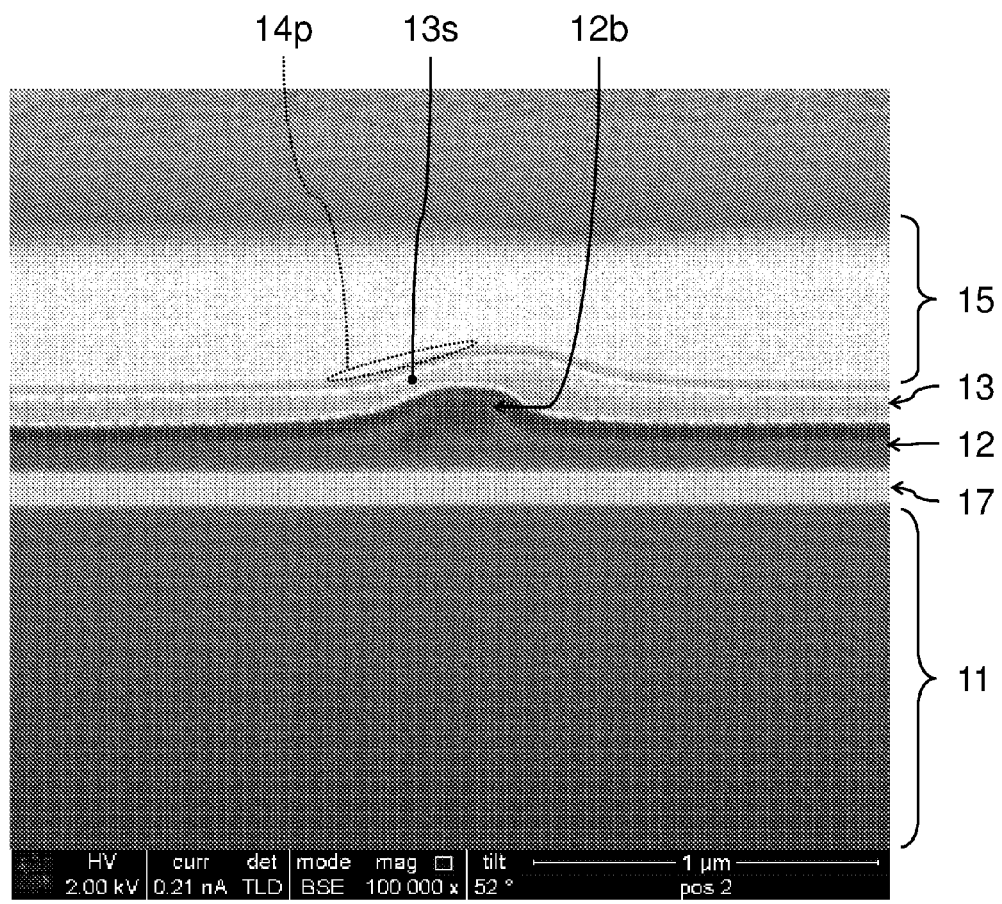
FIG. 5 shows a SEM image of a breach in an electro-optical device stack.

FIG. 5 shows a Scanning Electron Microscopy (SEM) image of a cross-section of an electro-optical device stack. In this image is shown how a bump 12b in the charge injection layer 12 may cause a local thinning 13s of the electro-optical layer 13. This local thinning 13s may be considered a 'breach' if it is thin enough to substantially allow protons from the charge injection layer 12 to pass through the local thinning 13s to react with a resist layer applied on top of the electro-optical layer 13. A thinning may be considered a breach if the local thickness of the electro-optical layer 13 is below 10 nm, even more so if it is below 5 nm or if the electro-optical layer 13 is absent over a local area, e.g. over an area of a few $\mu m^2$ up to several (100 $\mu m)^2$.

Additional layers shown in the SEM image are a cathode layer 15, an anode layer 17, and a substrate 11. Also shown is a location of a possible patch 14p that covers a possible breach formed by the local thinning 13s. In the presently shown image, the layer thicknesses of the electro-optical layer 13, charge injection layer 12, and anode layer 17 are on the order of 100 nm. In other embodiments, these layer thicknesses may vary.

The inventors found that a bump 12b such as shown may be the result of aggregation of the PEDOT:PSS material. Such aggregation was found to occur particularly when the concentration of PEDOT was increased. The increased concentration of PEDOT may be beneficial for increasing the conductivity of the charge injection layer. Unfortunately, the increased concentration of PEDOT may adversely affect a stability of the suspension leading to the formation of aggregates which may result in leakage current. However, with application of the presently disclosed processes, such leakage currents may be remedied. It is thus to be appreciated that, it may now be possible to increase the conductivity of the charge injection layer 12 without having to suffer from leakage currents. Accordingly, higher efficiencies may be reached.

Figure 6:
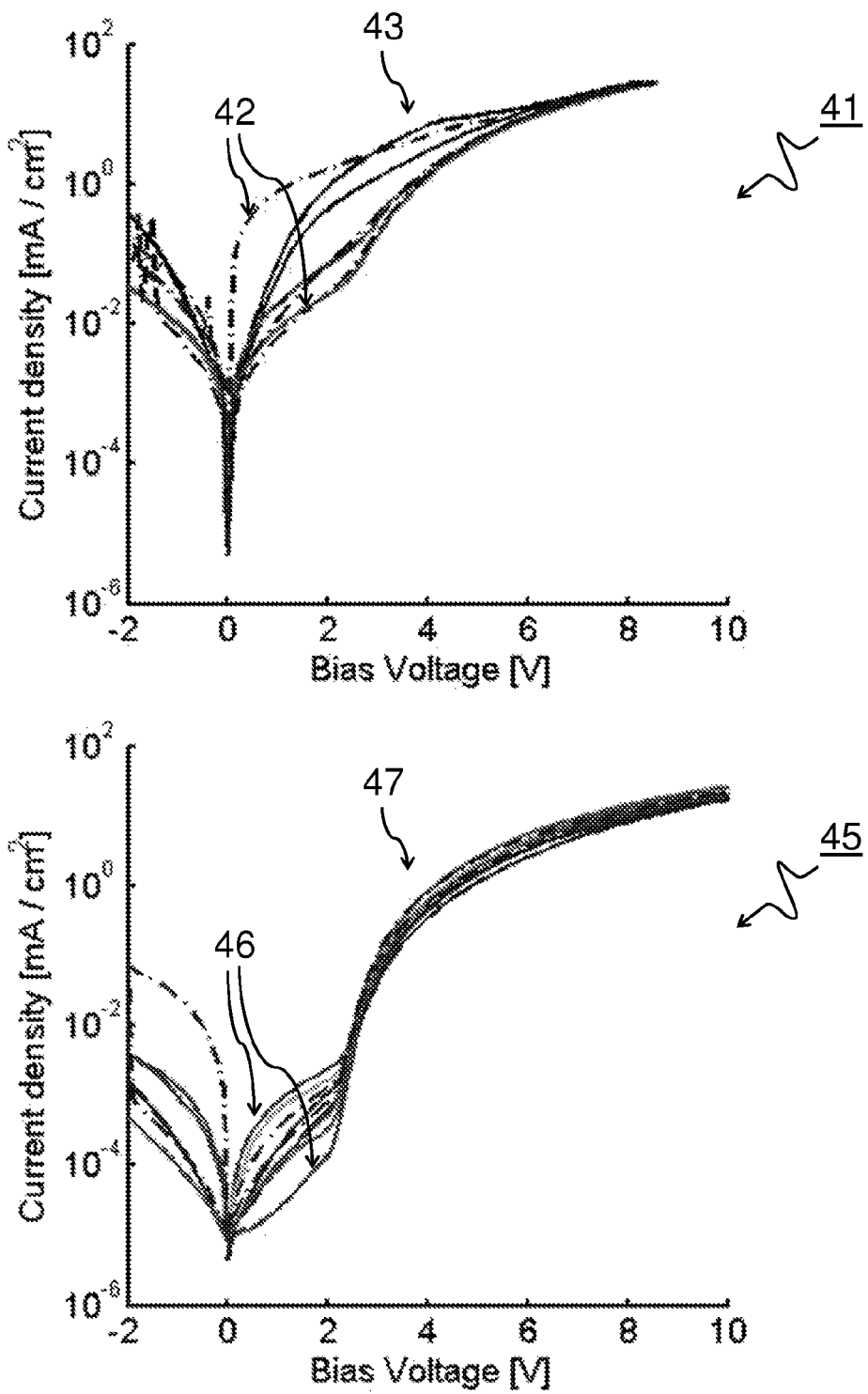
FIG. 6 show comparative leakage current measurement of electro-optical device stacks.

FIG. 6 shows comparative measurement between electro-optical device stacks without (41) and with (45) application of the presently disclosed process. The graphs 41 and 45 show measurements of current density in units of milliampere (mA) per square centimeter (cm$^2$) area of the device stack as a function of voltage in units of Volt (V) across the device stack. The measurements were taken by sweeping the applied voltage from 0 V to 9V, then back to −2 V and finally back to 0 V. It is noted that the graphs are semi-logarithmic.

Graph 41 shows, with different line styles, traces of four typical devices that are similar to those shown in graph 45, except that they were not subjected to the presently disclosed patching process. The presence of leakage current may be especially noticeable in the low voltage area 42 below 2 V. As shown e.g. the device indicated with the dash-dotted line in graph 41 has a high current density in the low voltage area 42. This voltage is normally too low to effectively cause a conduction in the electro-optical layer and this current is therefore suspected to correspond to leakage current through breaches in the electro-optical layer. In the high voltage area 43 the current densities are dominated by the normal behavior of the electro-optical layer, although the same leakage currents are still present (note the logarithmic Y-axis). It is noted that e.g. OLEDs with a high leakage current may have a higher chance to electrical failure during lifetime.

Graph 45 shows, with different line styles, traces of five typical devices that were manufacture using the presently disclosed patching process. The relative absence of leakage current may be especially visible in the low voltage area 46 below 2 V, especially when compared to the low voltage area 42 of graph 41. It may also be appreciated that the graphs in the high voltage are 47 are much more uniform than those in the high voltage area 43 of graph 41.

FIG. 7 shows an example of cationically-crosslinkable material 14m that may form a component in a suitable resist. The term "resist" as used herein refers more commonly to a material or compound that is able to undergo a chemical reaction that significantly changes its resistance to being dissolved by a corresponding developer (solvent), i.e. the solubility of the material or compound in the developer changes as a result of the chemical reaction. The change may be a decrease or increase in solubility. The chemical reaction may e.g. comprise a polymerization and/or crosslinking reaction that usually decreases solubility of the resist. Chemical reactions may be initiated or catalyzed e.g. by means of free radicals, anionically or cationically, metathesis or Diels-Alder reactions.

In some cases, the chemical reaction may be triggered by an initiator which may form or release a catalyst for the chemical reaction. E.g. in a photo-resist, a photo-acid may be used as an initiator that releases protons under the influence of light. The protons may in turn catalyze a crosslinking reaction in suitable molecules of the resist leading to a change in solubility. It is to be appreciated that for the presently disclosed processes and systems, the charge-injection layer may be regarded as an initiator, releasing protons into adjacent resist material. This reaction may be thermally stimulated to expedite the chemical reaction. While particular preference may be given to thermally stimulated cationic polymerization, in principle also other chemical reactions which are suitable for forming insulating patches can be used.

In addition to being able to change its solubility, it is preferred that the resist also has a low electrical conductivity, at least after the chemical reaction, for providing the electrically insulating patches. An appropriate resist molecule for this purpose is shown e.g. in FIG. 7. This molecule 14m is e.g. comprised in a resist that is commonly referred to as "SU-8". The molecule comprises eight epoxide groups. In an epoxide based polymer, an epoxide ring on a first molecule may become charged under the influence of a nearby proton. The charged ring may open up to form a connection to an epoxide group of a second molecule, which may also become charged. This charged ring may in turn form a connection to a third molecule and so on. The resulting interconnected network may be less soluble in the developer than the separate molecules. A typical waiting time between application of the resist and the subsequent removal may be several seconds up to minutes at ambient temperature (20 degrees Celsius) or at an elevated temperature of up to 100 degrees Celsius (depending e.g. on the resist material used).

A suitable developer for SU-8 may e.g. be 1-Methoxy-2-propanol acetate.

Other suitable cationically-polymerizable resists may e.g. comprise triarylamine, thiophene, trialkylphosphine, or oxetane. Preferably, a suitable resist has a resistivity higher than $10^7 \Omega$ cm after reaction. Preferably, a suitable resist has high chemical and structural stability, in combination with the materials (e.g. solvents) and process conditions (e.g. temperature) used for further device processing. A reaction speed of the resist may be defined in terms of a "conversion rate" or "conversion percentage" of the reactive groups. In one example, an insoluble material is obtained after >50% conversion (local) of monomers, e.g. crossing the gel point. It will be appreciated that, the higher the number of functional groups per monomer, the lower this number can be. A conversion above the gel point is preferably reached within seconds up to a few minutes. In one example, a conversion rate is determined off-line using FT-IR.

Suitable resist materials may include (super-)acid initiated low dielectric polymerizable monomers such as systems that cure by ring opening polymerization including small ling systems, such as epoxides or larger ring systems, such as oxetanes (cationic cure). The cross-linking functionalities may further be based on functional building blocks such as oligo(ethylene oxide), poly(ethylene oxide), alkyl blocks, aliphatic poly- or oligoesters, aromatic poly- or oligoesters, poly- or oligobutadienes, aliphatic poly- or oligoethers, aromatic poly- or oligoethers, aliphatic poly- or oligocarbonates, aromatic poly- or oligocarbonates, aliphatic poly- or oligouethanes, aromatic poly- or oligourethanes, aliphatic urethanes, aromatic urethanes, polyphenols, alkoxylated phenols, aliphatic poly- or oligoepoxides, aromatic poly- or oligoepoxides (e.g. based on biphenol-A or ethoxylated bisphenol-A), neopentyl glycol, pentaerythritol, dipentaerythritol, trimethylol propane, ethoxylated trimethylol propane, caprolactone, poly- or oligosiloxanes, aliphatic poly- or oligopeptides, aromatic poly- or oligopeptides, aliphatic poly- or oligoamines, aromatic poly- or oligoamines, poly- or oligostyrene, or any combination thereof.

Figure 8:
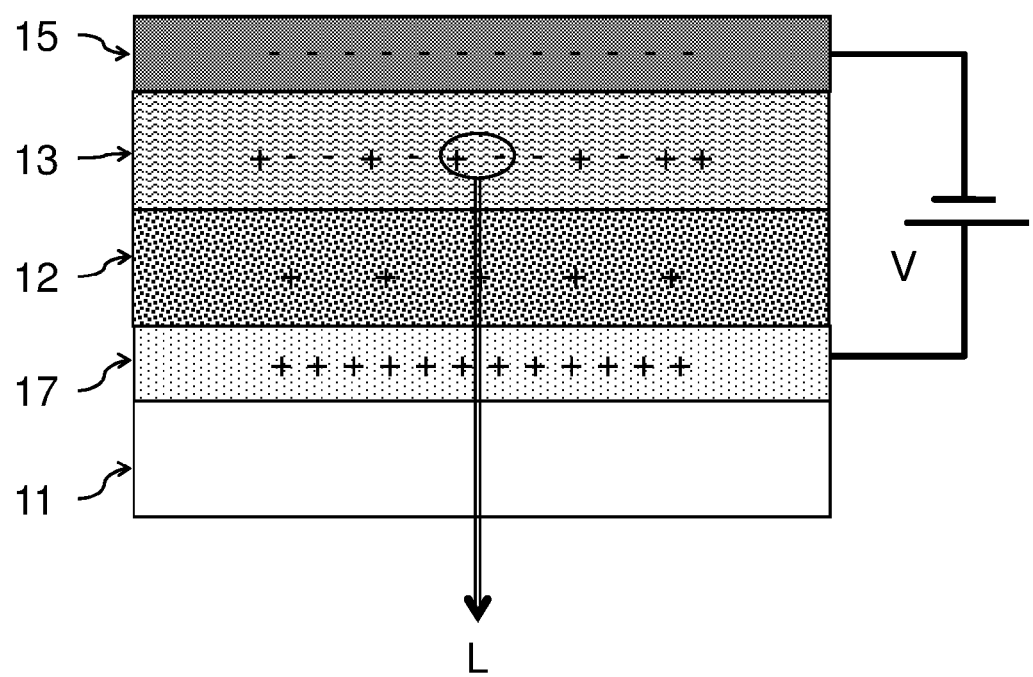
FIG. 8 shows a PLED device comprising an electro-optical device stack.

FIG. 8 shows a Polymer-based Light Emitting Device, PLED 10p, comprising an electro-optical device stack. The electro-optical device stack comprises a multi-layered structure comprising a charge injection layer 12, a cathode layer 15, and an electro-optical layer 13 arranged between the charge injection layer 12 and the cathode layer 15. The PLED 10p further comprises an anode layer 17 and a substrate 11. A voltage V applied over the anode layer 17 and cathode layer 15 may result in recombination of charges in the electro-optical layer 13 leading to emission of light L. In the shown embodiment of a bottom emitting device, preferably, the layers 11, 17, and 12 are substantially transparent to light L. Alternatively or in addition also the layers 13 and 15 may be substantially transparent to light L thus providing a top emitting and/or a fully transparent LED device.

In one example, the electro-optical layer 13 comprises poly(p-phenylene vinylene) (PPV). In another example, the electro-optical layer 13 comprises poly[9,9-bis(octyl)-fluorene-2,7-diyl] (PF) blended with a phosphorescentiridium complexes with triplet energy levels. The charge injection layer 12 preferably comprises PEDOT:PSS. The anode layer 17 preferably comprises Indium Tin Oxide (ITO). If the electrical conductivity of layer 12 is sufficiently high, layer 17 may be omitted. The substrate 11 may comprise a flexible material, e.g. comprising polyethylene naphthalate (PEN) or polyethylene terephthalate (PET). Alternatively, the substrate 11 may be rigid, e.g. comprising glass.

In a PLED device 10p produced according to the presently disclosed process, breaches in the electro-optical layer 13 between the charge injection layer 12 and the cathode layer 15 may be covered with electrically-insulating patches comprising cationically cross-linked resist material (not shown here), wherein the resist material has reacted with protons from the charge injection layer by a cationic cross-linking reaction. While the present figure shown a light emitting device, a similar device stack produced according to the presently disclosed process, may also function as a photovoltaic device, wherein light is absorbed rather than emitted in an electro-optical layer 13 and used for generating a voltage V.

Figure 9:
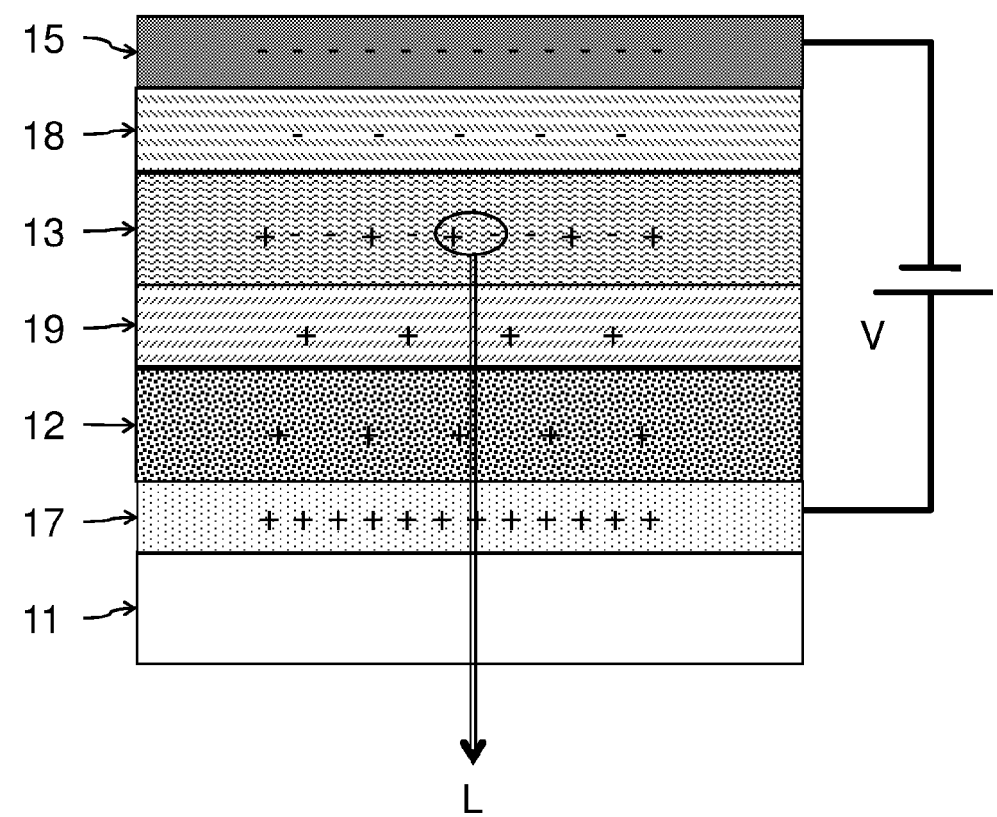
FIG. 9 shows a SMOLED device comprising an electro-optical device stack.

FIG. 9 shows a Small Molecule-based Organic Light Emitting Device, SMOLED 10s, comprising an electro-optical device stack. The electro-optical device stack again comprises a multi-layered structure comprising a hole injection layer 12, a cathode layer 15, and an electro-optical layer 13 arranged between the charge injection layer 12 and the cathode layer 15. In addition, an electron transporting layer 18 is provided between the electro-optical layer 13 and the cathode layer 15. Furthermore, a hole transporting layer 19 is provided between the electro-optical layer 13 and the charge injection layer 12. The presently disclosed process may be applicable when the hole transporting layer 19 is able to provide protons either directly or indirectly from the charge injection layer 12 to react with resist material that is applied during production onto the electro-optical layer 13. As in FIG. 8, a voltage V applied over the anode layer 17 and cathode layer 15 may result in recombination of charges in the electro-optical layer 13 leading to emission of light L. In the shown embodiment of a bottom emitting device, preferably, the layers 11, 17, 12, and 19 are substantially transparent to light L. Alternatively or in addition also the layers 13, 18 and 15 may be substantially transparent to light L thus providing a top emitting and/or a fully transparent LED device.

In one example, the electron transporting layer 18 comprises substances known in the art as TAZ, PBD, or $Alg_3$. The electro-optical layer 13 may comprise e.g. $Alq_3$/DPT, BTX, TAZ/Ir(ppy)$_3$, or CBP/FIrpic. The hole transporting layer 19 may comprise e.g. TPD, α-NPD, or m-MTDATA. The charge injection layer 12 may comprise e.g. PEDOT: PSS. Also other substances and compositions are possible. Layers in these and other embodiments may be added, combined and/or omitted without departing from the present scope.

Figure 10:
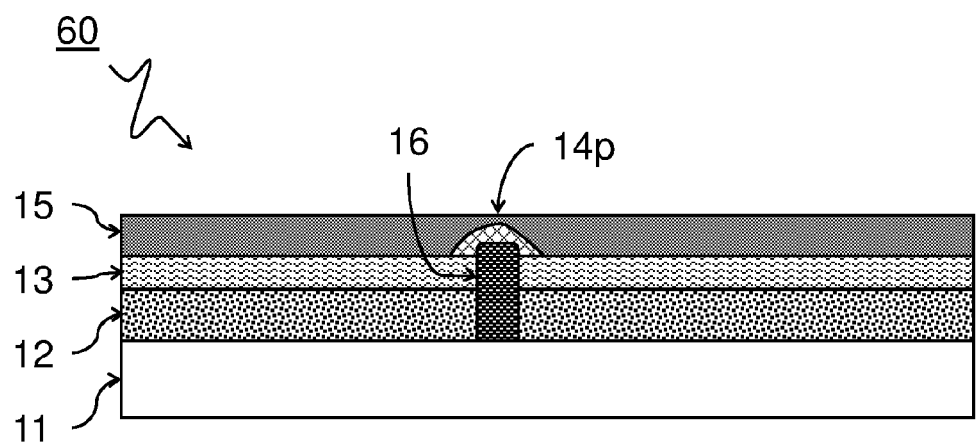
FIG. 10 shows another embodiment of an electro-optical device stack.

FIG. 10 shows another embodiment of an electro-optical device stack 60. The electro-optical device stack 60 comprises an electrode 16 comprising an oxidizing material, e.g. iron. Such an electrode may be applied e.g. as a metal grid to provide a more even voltage distribution to the anode layer, e.g. a charge injection layer 12 or a hole conducting layer.

The electro-optical device stack 60 may be produced according to a similar method as discussed in FIG. 1. In particular, the electro-optical device stack 60 may be manufactured by a method comprising the steps of (compare FIG. 1)

(A) providing a substrate 11 with an electrode 16 and a multi-layered structure comprising an electro-optical layer 13 on top of the substrate 11 and electrode 16, the electrode 16 comprising an oxidizing material;

(B) depositing a resist layer comprising a radical-polymerizable resist material onto the electro-optical layer 13.

(C) having the resist material react adjacent breaches in the electro-optical layer 13 by a radical-polymerization reaction induced by radicals from oxidizing material of the electrode 16 thereby covering said breaches with patches 14p comprising radical-polymerized resist material; and (D) removing parts of the resist material that have not polymerized, wherein the patches 14p remain arranged for providing electrical insulation between the charge injection layer 12 and a layer 15 subsequently deposited onto the electro-optical layer 13 and patches 14p. The layer 15 may e.g. comprise a layer forming a counter-electrode for the electrode 16.

The previously discussed idea of using protons from a charge injection layer may thus be extended to using free radicals from an oxidizing electrode 16 to similarly form a patch 14p to reduce leakage current. A suitable resist may be a resist that polymerizes under the influence of free radicals. Examples of radical polymerizable resist materials may include materials that cure by radical addition polymerization such as acrylates, methacrylates, and thiol-ene systems One possible difference with the previously described cationically stimulated polymerization may be that radical-polymerization may be halted when two radicals meet, cancelling each other out. This may put a limit on the layer thickness of the patch that can be grown using radical-polymerization.

While in the foregoing discussion, example embodiments of methods, systems, and products were shown, also alternative embodiments may be used for achieving similar results. E.g. some steps of the methods, components of the systems, or layers in the products may be combined or split up into one or more alternative steps, components or layers having similar results. E.g. system components may be split into separate and/or dedicated components or be comprised in integrated components, e.g. circuitry. The various elements of the embodiments as discussed and shown offer certain advantages, such as providing a self-aligning method for reducing leakage current in electro-optical devices. Of course, it is to be appreciated that any one of the above embodiments or processes may be combined with one or more other embodiments or processes to provide even further improvements in finding and matching designs and advantages. It is appreciated that this invention offers particular advantages to electro-optical devices, and in general can be applied for any application wherein breaches are patched with a suitable resist reacting with a material on the other side of the breached layer.

While it is recognized that the presently disclosed methods and systems are particularly suitable for reacting a resist material at breaches in an electro-optical layer contacting an acidic charge injection layer, the methods and systems may find broader application. For example, the present disclosure may be generally applied in a method of manufacturing a device stack. The method comprises providing a first layer (e.g. charge injection layer) contacting a second layer (e.g. electro-optical layer), the first layer, comprising, either naturally or by addition, an initiator compound (e.g. cations or radicals). The method further comprises depositing a resist layer onto the second layer, the resist layer comprising a resist material that reacts with the said initiator compound (e.g. by polymerization crosslinking). The method further comprises having the resist material react adjacent breaches in the second layer by a reaction induced and/or catalyzed by the initiator compound from the first layer thereby forming patches of reacted resist material covering said breaches. And the method further comprises removing parts of the resist material that have not reacted, e.g. polymerized, wherein the patches remain arranged for providing electrical and/or other types of insulation between the first layer, and a layer subsequently deposited onto the second layer and patches. Analogously there may be provided a system for implementing this method. The other types of insulation may e.g. comprise thermal insulation. Alternatively or in addition, the patches may e.g. act as an insulating barrier against environmental factors such as oxygen or moisture.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the scope of the present systems and methods as set forth in the claims that follow. The specification and drawings are accordingly to be regarded in an illustrative manner and are not intended to limit the scope of the appended claims.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise; no specific sequence of acts or steps is intended to be required unless specifically indicated; and no specific ordering of elements is intended to be required unless specifically indicated.

The invention claimed is:

1. Method of manufacturing an electro-optical device stack, the method comprising
   providing a charge injection layer contacting an electro-optical layer, the charge injection layer comprising an initiator compound;
   depositing a resist layer onto the electro-optical layer, the resist layer comprising a resist material that reacts with the said initiator compound;
   having the resist material react adjacent breaches in the electro-optical layer by a reaction induced and/or catalyzed by the initiator compound from the charge injection layer thereby forming patches of reacted resist material covering said breaches; and
   removing parts of the resist material that have not reacted wherein the patches remain arranged for providing electrical insulation between the charge injection layer, and a layer subsequently deposited onto the electro-optical layer and patches.

2. Method according to claim 1, wherein the charge injection layer comprises an electrode and the initiator compound comprises oxidizing material comprised in the electrode; and the method comprises
   depositing a resist layer comprising a radical-polymerizable resist material onto the electro-optical layer;
   having the resist material react adjacent breaches in the electro-optical layer by a radical-polymerization reaction induced by radicals from oxidizing material of the electrode thereby forming patches of radical-polymerized resist material covering said breaches; and
   removing parts of the resist material that have not polymerized, wherein the patches remain arranged for providing electrical insulation between the charge injection layer and a layer subsequently deposited onto the electro-optical layer and patches.

3. Electro-optical device stack obtainable by the method of claim 2, the device stack comprising a multi-layered structure comprising
   a charge injection layer comprising an electrode comprising an oxidizing material;
   a cathode layer; and
   an electro-optical layer arranged between the charge injection layer and the cathode layer;
   wherein breaches in the electro-optical layer between the charge injection layer and the cathode layer are covered with electrically-insulating patches comprising radical polymerized resist material.

4. Method according to claim 1, wherein the initiator compound comprises an acidic compound comprised in the charge injection layer; and the method comprises
   depositing a resist layer onto the electro-optical layer, the resist layer comprising a cationically-crosslinkable resist material;
   having the resist material react adjacent breaches in the electro-optical layer by a cross-linking reaction induced by protons from the charge injection layer thereby forming patches of cross-linked resist material covering said breaches; and
   removing parts of the resist material that have not cross-linked, wherein the patches remain arranged for providing electrical insulation between the charge injection layer and a layer subsequently deposited onto the electro-optical layer and patches.

5. Method according to claim 1, further comprising
   depositing a cathode layer onto the electro-optical layer and patches, wherein the patches are arranged for providing electrical insulation between the charge injection layer and the cathode layer.

6. Method according to claim 1, wherein said having the resist material react comprises heating the device stack during a predetermined time period for growing the patches.

7. Method according to claim 1, wherein the electro-optical layer has an average layer thickness of 10-500 nm.

8. Method according to claim 1, wherein the charge injection layer comprises poly(3,4-ethylenedioxythiophene) poly(styrenesulfonate) (PEDOT:PSS).

9. Method according to claim 1, wherein said depositing a resist layer onto the electro-optical layer, comprises depositing a solvent comprising the cationically-crosslinkable resist material and evaporating the solvent.

10. Electro-optical device stack made by a method comprising
    providing a charge injection layer comprising an acidic compound and contracting an electro-optical layer;
    depositing a resist layer onto the electro-optical layer, the resist layer comprising a cationically-crosslinkable resist material;
    having the resist material react adjacent breaches in the electro-optical layer by a cross-linking reaction induced by protons from the charge injection layer, thereby forming electrically-insulating patches comprising cationically cross-linked resist material covering said breaches;
    removing parts of the resist material that have not cross-linked; and
    depositing a cathode layer onto the electro-optical layer and the electrically-insulating patches;
    wherein the braches in the electro-optical layer are positioned between the charge injection layer and the cathode layer and are covered with the electrically-insulating patches comprising cationically cross-linked resist material.

11. Electronic device comprising an electro-optical device stack according to claim 10.

12. System for manufacturing an electro-optical device stack, the system comprising
a supply system arranged for providing a substrate;
first deposition means arranged for depositing a charge injection layer onto the substrate, the charge injection layer comprising an initiator compound;
second deposition means arranged for depositing an electro-optical layer onto the charge injection layer;
resist layer deposition means arranged for depositing a resist layer onto the electro-optical layer, the resist layer comprising a resist material that reacts with the said initiator compound;
a controller configured for controlling the supply system, first deposition means, second deposition means, and resist layer deposition means for providing the substrate with a multi-layered structure comprising the electro-optical layer sandwiched between the charge injection layer and the resist layer;
the system further comprising resist layer removal means arranged for at least partially removing the said resist material, wherein the controller is configured for
controlling the device stack for having the resist material react adjacent breaches in the electro-optical layer by a reaction induced and/or catalyzed by the initiator compound from the charge injection layer thereby forming patches of cross-linked resist material covering said breaches; and
controlling the resist layer removal means, for removing parts of the resist material that have not reacted, wherein the patches remain arranged for providing electrical insulation between the charge injection layer and a layer subsequently deposited onto the electro-optical layer and patches.

13. System according to claim 12, further comprising electrode layer deposition means, wherein the controller is arranged for
controlling the electrode layer deposition means for depositing a cathode layer onto the electro-optical layer and patches, wherein the patches are arranged for providing electrical insulation between the charge injection layer and the cathode layer.

14. System according to claim 12, wherein the charge injection layer comprises an acidic compound and the resist layer comprises a cationically-crosslinkable resist material that reacts to the acidic compound by a crosslinking reaction.

15. System according to claim 12, wherein the charge injection layer comprises an electrode comprising an oxidizing material and the resist layer comprises a radical-polymerizable resist material that reacts to radicals of the oxidizing material of the electrode by a polymerization reaction.

* * * * *